United States Patent [19]

Zarowin et al.

[11] Patent Number: 5,290,382
[45] Date of Patent: Mar. 1, 1994

[54] METHODS AND APPARATUS FOR GENERATING A PLASMA FOR "DOWNSTREAM" RAPID SHAPING OF SURFACES OF SUBSTRATES AND FILMS

[75] Inventors: Charles B. Zarowin, Rowayton; L. David Bollinger, Ridgefield, both of Conn.

[73] Assignee: Hughes Aircraft Company, Los Angeles, Calif.

[21] Appl. No.: 807,536

[22] Filed: Dec. 13, 1991

[51] Int. Cl.⁵ ............................................. H01L 21/00
[52] U.S. Cl. ..................................... 156/345; 156/643; 118/723 ME; 118/723 EK; 219/121.36; 313/231.31; 315/111.21
[58] Field of Search ................ 156/643, 345; 118/723; 427/569, 446, 34, 294; 219/121.36, 121.4, 0.47, 0.48; 313/231.31, 231.51, 231.61; 315/111.21, 111.77

[56] References Cited

U.S. PATENT DOCUMENTS

| | | | |
|---|---|---|---|
| 4,088,926 | 5/1978 | Fletcher et al. | 315/111.21 |
| 4,350,578 | 9/1982 | Friesen et al. | 204/298 |
| 4,461,954 | 7/1984 | Inone | 219/121.4 |
| 4,668,366 | 5/1987 | Zarowin | 204/298.32 |
| 4,793,975 | 12/1988 | Drage | 156/345 |
| 4,853,250 | 8/1989 | Boulos et al. | 427/446 |
| 4,859,908 | 8/1989 | Yoshida et al. | 118/723 |
| 5,000,771 | 3/1991 | Fleming et al. | 156/643 |
| 5,144,196 | 9/1992 | Gegenwart et al. | 315/111.21 |

FOREIGN PATENT DOCUMENTS 61-139029 6/1986 Japan.

OTHER PUBLICATIONS

Rapid, nonmechanical, damage-free figuring of optical surfaces using plasma-assisted chemical etching (PACE): Part I Experimental results; by L. David Bollinger and Charles B. Zarowin; SPIE vol. 966; 1988.
Rapid, nonmechanical, damage-free figuring of optical surfaces using plasma-assisted chemical etching (PACE): Part II Theory & Process Control; by L. David Bollinger and Charles B. Zarowin; SPIE vol. 966; 1988.
Predicted polishing behavior of Plasma assisted chemical etching (PACE) from a unified model of the temporal evolution of etched surfaces; G. M. Gallatin and C. B. Zarowin; SPIE vol. 966; 1988.
Rapid, non-contact, damage free shaping of optical & other surfaces with plasma assisted chemical etching; C. B. Zarowin & L. D. Bollinger; IEEE 43rd Annual Symposium on Frequency Control; 1989.
Unified approach to the temporal evolution of surface profiles in solid etch and deposition processes; G. M. Gallatin and C. B. Zarowin; Journal of Applied Physics; vol. 65; 1989.

(List continued on next page.)

Primary Examiner—Tom Thomas
Assistant Examiner—George Goudreau
Attorney, Agent, or Firm—Michael W. Sales; Wanda K. Denson-Low

[57] ABSTRACT

A gas, which is flowed into a plasma chamber 12 positioned "upstream" from a etching reaction site on a substrate 20, is converted into a plasma and its active species by the application of excitation. The means for excitation may be radio frequency power or microwave power. The excitation is decoupled from the substrate so as to prevent "print through" effects caused by electrical and geometric characteristic of the substrate. The active species are then flowed "downstream" from the plasma chamber 12 to the surface of the substrate 20 through an outlet 16 having an interactive flange 18 attached to the terminal end. The interactive flange 18 provides a surface separate from the substrate to consume the active species. The interactive flange inhibits the etching reaction from occurring outside of the local material removal footprint. The distance between the oulet and surface of the substrate is adjustable to provide a means to control the material removal footprint and removal footprint profile.

8 Claims, 2 Drawing Sheets

OTHER PUBLICATIONS

Review of precision surface generating processes and their potential application to the fabrication of large optical components; J. F. Stowers; SPIE; vol. 966; 1988.

Rapid, non-contact optical figuring of aspheric surfaces with plasma assisted chemical etching (PACE); D. Bolling, G. Gallatin, J. Samuals, G. Steinberg, C. Zarowin; SPIE; vol. 1333; 1990.

Rapid optical figuring of aspherical surfaces with plasma assisted chemical etching (PACE); L. D. Bollinger, G. Steinberg, C. B. Zarowin; SPIE: vol. 1618; 1991.

A comparison using surface evolution theory of the smoothing and figuring of optics by plasma assisted chemical etching and ion milling; C. B. Zarowin; SPIE; vol. 1618; 1991.

Predicted polishing behavior of plasma assisted chemical etching (PACE) from a unified model of the temporal evolution of etched surfaces; G. M. Gallatin and C. B. Zarowin; SPIE; vol. 966; 1988.

A theory of plasma-assisted chemical vapor transport processes; C. B. Zarowin; Journal of Applied Physics; vol. 57(3); 1985.

Relation between the RF discharge parameters and plasma etch rates, selectivity, and anisotropy; C. B. Zarowin; J. Vac. Sci Technol. A2(4) (1984).

"Rapid, Nonmechanical, Damage-Free Figuring of Optical Surfaces Using Plasma-Assisted Chemical Etching" (PACE); Parts I-II; S.P.I.E.; vol. 966; Advances In Fabrication and Metrology For Optics And Large Optics; (1989); pp. 82-97; Bollinger et al.

"Localized Plasma Etching For Device Optimization"; Larson et al.; J. Vac. Sci. Tech.; 10(1); pp. 27-29; (1992).

"Rapid Non-Mechanical Damage Free Figuring of Optical Surfaces Using Plasma Assisted Chemical Etching (PACE)II"; Proc. SPIE; vol. 966; pp. 91-97; (1989) Zarowin et al.

"Rapid-Non-Contact, Damage Free Shaping Of Optical And Other Surfaces With Plasma Assisted Chemical Etching"; Proc. of 43rd Annual Symposium on Frequency Control; (1989); IEEE; pp. 623-626; Zarowin et al.

"Predicted Polishing Behavior of Plasma Assisted Chemical Etching (PACE) From A Unified Model of The Temporal Evolution of Etched Surfaces"; Proc. S.P.I.E.; vol. 966; Gallitin et al.; (1989) pp. 98-107.

"Review of Precission Surface Generating Processing and Their Potential Application to the Fabrication of Large Optical Components"; Proc. SPIE; Stowers et al.; (1989); vol. 966, pp. 62-73.

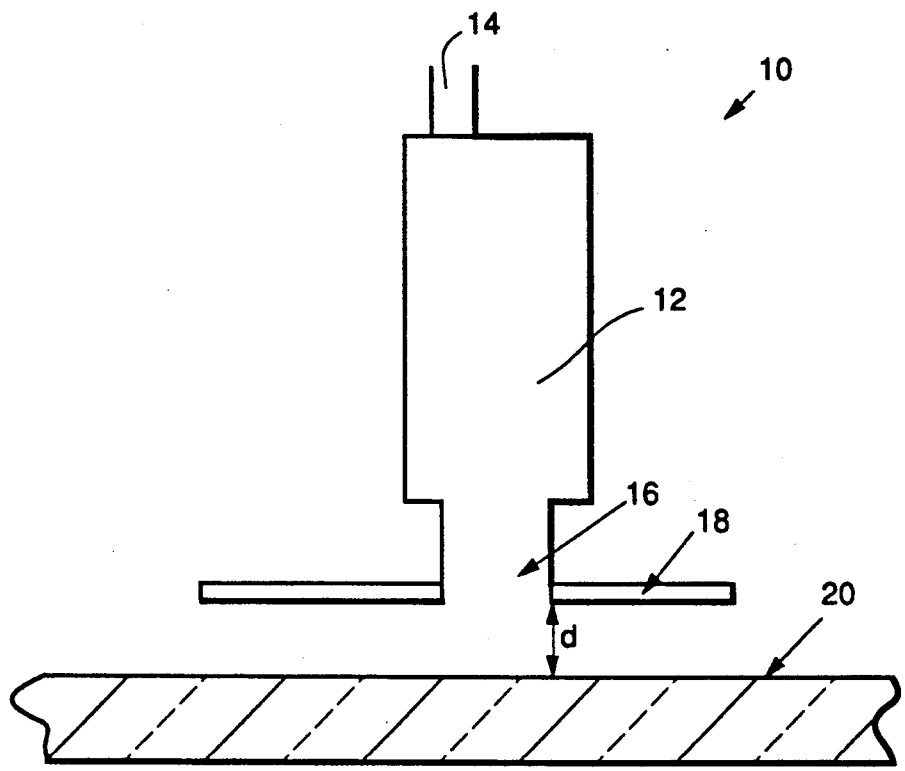
FIG. 1.
FIG. 2.
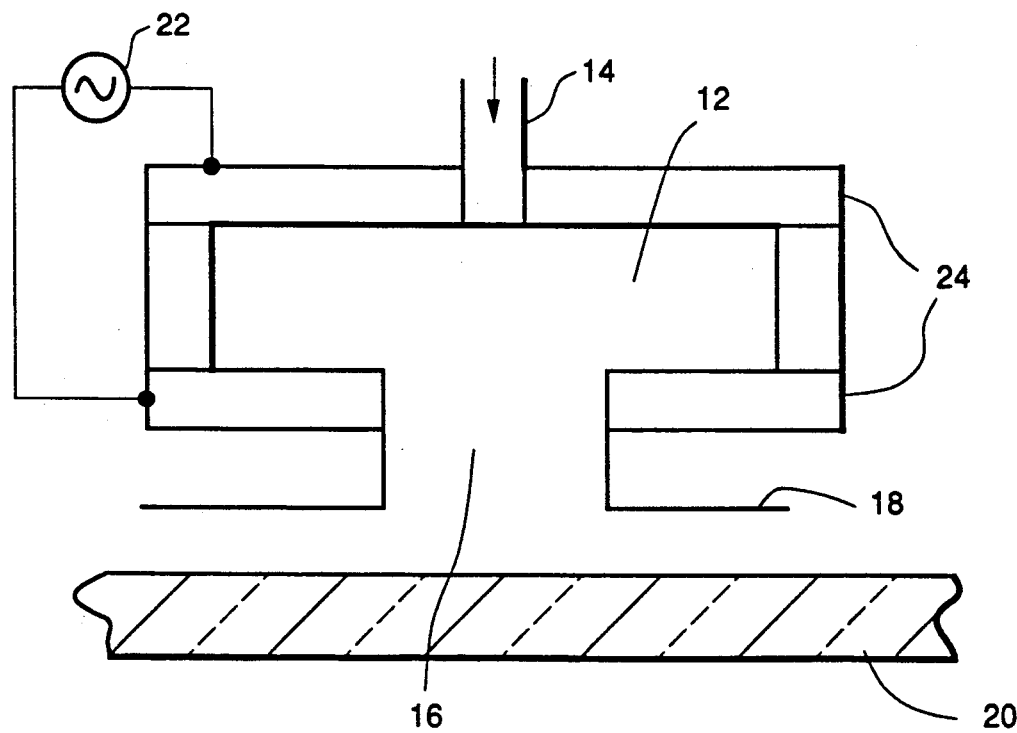

METHODS AND APPARATUS FOR GENERATING A PLASMA FOR "DOWNSTREAM" RAPID SHAPING OF SURFACES OF SUBSTRATES AND FILMS

BACKGROUND OF THE INVENTION

1. Field of the Invention

The present invention relates to a method and apparatus for controlled material removal from the surface of a substrate over a confined region, and more particularly, to a method and apparatus for removing material from the surface of a substrate by a reactive and excited species created in a plasma generated so that the substrate is independent of the means for generating the plasma. The present invention provides a means for accomplishing controlled, localized material removal for error correction in precision figuring of optical surfaces and thickness profile controlling of films of semiconductor devices while avoiding the effects of substrate geometry on the removal process and a reducing the potential contamination of the surface of the substrate.

2. Description of the Prior Art

Conventional processes for thinning and figuring surfaces and films often employ such methods as mechanical polishing, grinding, sputtering, sand blasting, and chemomechanical processes. Each of these prior art processes usually have substantial processing limitations. For example, chemomechanical processes for thinning semiconductor films is a contact method that leaves contaminants on the surface which cause subsurface damage to the substrate. Also, chemomechanical thinning processes do not allow corrections of the spatial variations within the film thickness.

Plasma assisted chemical etching methods to shape surfaces of substrates are an improvement over the prior art processes such as chemomechanical thinning because such plasma processes do not contact the substrate surface, and, therefore, reduce the potential for subsurface damage. U.S. Pat. No. 4,668,336 discloses a method and apparatus for figuring a surface by plasma assisted chemical transport where the substrate surface is mounted in close proximity to at least one electrode of an rf driven reactor having two parallel plate electrodes. Removal of material from the surface of a substrate is controlled by varying the amount of time an electrode with small surface area spends at a given region wherein the entire surface of the substrate is subjected to the presence of reactive gas which in the presence of an rf field between the two electrodes forms a plasma. Thus, material removal is effected by a plasma which is generated at the surface where material removal is desired. A disadvantage to the invention disclosed therein is that the profile of the surface where the material has been removed may not be precisely controlled.

A related patent application entitled "Method and Apparatus for Confinement of a Plasma Etched Region for Precision Shaping of Surfaces of Substrates and Films", by C. B. Zarowin and L. D. Bollinger, filed on the same date hereof and assigned to the same assignee, discloses a plasma assisted chemical etching device which confines the etching plasma to a local surface area of the substrate surface. The local confinement allows control of the material removal footprint and, thus, the control of the profile of the surface where material has been removed. Because the device disclosed therein is of the type where the plasma excitation occurs by rf discharge directly coupled to the substrate (the local substrate surface is effectively an electrode where the reaction is occurring), underlying surface structure may cause variations in the material removal rate which is a primary cause of "print through" problems.

The "print through" problems associated with local coupled plasma generation can be solved by generating a plasma away from the etching surface to carry out the etching reaction "downstream". When plasma assisted chemical etching is done in a "downstream" mode, long-lived chemically reactive species created in the plasma are carried by the flow "downstream" to the etching reaction site. U.S. Pat. No. 4,431,898 describes a method to generate plasma away from the etching surface for "downstream" stripping of photoresist from an entire wafer. The patent discloses an apparatus which has a plasma chamber inductively coupled to a source of A.C. power wherein the semiconductor devices are etched and an alternative embodiment where the stripping or etching of the substrate takes place "downstream". The downstream method produces a dry chemical removal process over the substrate which eliminates damage to the substrate which could result from energetic species. However, the method disclosed therein fails to provide a means to make precise changes to the profile of the surface where material is removed and, therefore, is not useful for local error correction of a substrate surface.

The present invention incorporates the advantages of decoupled plasma assisted chemical etching with a means to perform local etching so as to correct spatial errors in the substrate surface or correct the thickness profile of a film on a substrate.

SUMMARY OF THE INVENTION

The present invention is directed to a method and apparatus for local plasma assisted chemical etching wherein the plasma is generated away and independent (decoupled) from a substrate etching surface. The process of decoupling plasma generation from the etching reaction site avoids many of the problems associated with substrate geometry when the plasma is generated locally and coupled to the site. In particular, the advantage of decoupled plasma generation is that it avoids uncontrolled removal rate variations caused by subsurface structure when the plasma is generated locally. Thus, the present invention provides a means to control local material removal rates.

The present invention generally comprises a plasma chamber having a gas inlet, and an outlet for flowing a chemically reactive and neutral species created by a plasma "downstream" to a reaction site on the surface of a substrate. The independently generated plasma is generated in a region which is located a distance away from the substrate surface that is to be etched. The plasma and its chemically reactive and neutral species may be generated "upstream" by a radio frequency (rf) power source directly coupled to the plasma and gas mixture as in a parallel plate rf discharge, inductively coupled to the plasma and gas mixture as in a toroidal coil rf discharge, or capacitively coupled to the plasma and gas mixture as in a solenoid coil driven at high frequencies. The plasma and reactive species may also be generated "upstream" by microwave excitation techniques. The plasma generated by any of the above means flows "downstream" to the reaction site through an outlet which may have an interactive shaped skirt to prevent etching outside of a local material removal footprint. The footprint is defined by the size of the outlet, the distance from the substrate, the gas flow, and the plasma parameters.

Material removal on the surface of the substrate is performed locally by chemically reactive species created by the "upstream" plasma. The chemical reaction rate at the surface may be enhanced by a flux of non-thermal energy carried by the excited neutral species also created by the "upstream" plasma. Because the plasma generation is sufficiently far from the surface of the etching area, undesired and short-lived active species such as ions are temporally "filtered" out of the reactive plasma gas flow stream before reaching the etching surface. The remaining long-lived excited neutral and chemically reactive "radicals" are carried "downstream" through the outlet to the local etching surface by the gas flux. These long-lived species enhance the rate of chemical reaction at the surface by giving up their stored energy during the etching process.

In addition to decoupled plasma generation, the shaped gas outlet of the present invention provides a means to prevent unwanted etching outside the localized material removal footprint by supplying a surface separate from the substrate to consume the reactive species. Thus, the present invention provides a useful and controllable means for correcting local surface errors in the optical figuring and film thinning processes that is non-damaging and non-contaminating to the surface of the substrate.

One objective of the present invention is to provide a means for performing a plasma assisted chemical etching reaction.

Another objective of the present invention is to provide a means for material removal by a chemically reactive species from a plasma generated independent of the electrical and geometric characteristics of the substrate.

Another objective of the present invention is to provide a means for local application of a decoupled plasma for precision optical figuring or film thinning.

Another objective of the present invention is to provide a means for preventing unwanted etching reactions outside of the local material removal footprint.

Other objects and advantages of the present invention will become apparent to those skilled in the art from the following detailed description read in conjunction with the attached drawings and claims appended hereto.

DESCRIPTION OF THE DRAWINGS

FIG. 1 is a schematic diagram of a plasma reactor with an integral interactive skirt at the outlet for controlling local material removal in the downstream mode.

FIG. 2 is a schematic diagram of a parallel plate rf discharge downstream plasma reactor system.

DETAILED DESCRIPTION OF THE PRESENT INVENTION

Figure 4:
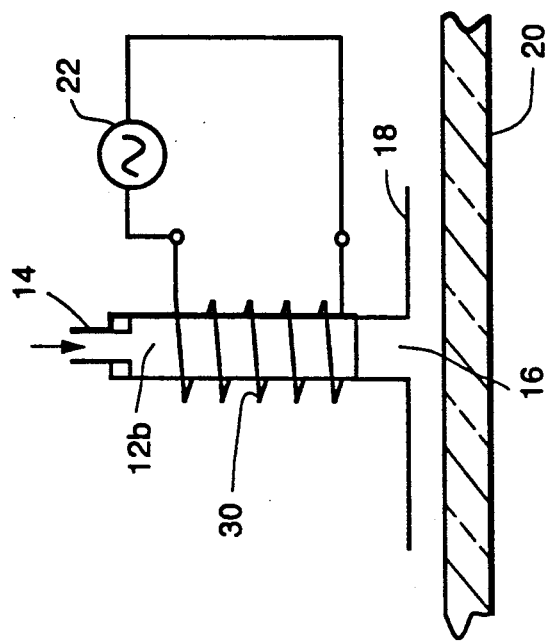
FIG. 4 is a schematic diagram of an rf discharge downstream plasma reactor system driven by a solenoid coil.

The plasma assisted chemical etching method of the present invention for figuring optical surfaces and thinning films on substrates is generally performed by passing active species (chemically reactive and excited species) generated in a plasma region on to a substrate surface to be etched. The active species created are generated by excitation which is "upstream" and independent of the surface to be etched. By exciting the plasma and active species thereof independent or decoupled from the substrate rather than excitation by means which incorporates the substrate, the influences of the electrical and geometric characteristics of the substrate may be avoided. Thus, the decoupled generation of the plasma and active species thereof provide a means to prevent the occurrence of "print through" phenomena typically experienced when plasma is generated by an excitation means which incorporates the substrate therein. Decoupled plasma generation requires the use of higher power densities to generate the active species because those species must travel to the etching site while still excited but not directly influenced by the means for excitation. The use of higher power densities, in turn, can cause local etching of the region where the plasma is generated. The method of the present invention incorporates the use of apparatus which can overcome these shortfalls, such as "print through" and local etching at plasma generation region.

Referring to FIG. 1, the apparatus of the present invention includes a plasma assisted chemical etching reactor 10 for performing local "downstream" etching reactions of substrate surfaces which comprises a plasma chamber 12 having a gas inlet 14 at one end and a gas outlet 16 at the other end. The inlet 14 is connected to a source of gas (not shown). The gas introduced into the plasma chamber is transformed into a plasma by the application of a source of excitation. The excitation source may be radio frequency (rf) power or microwave energy. The "downstream" outlet 16 comprises an orifice which is approximately dimensioned to the size of the removal footprint desired for local material removal. The outlet may have an associated skirt 18 attached to its terminal end which is fabricated out of a material which is interactive with active species responsible for "downstream" etching. Silicon and carbon are materials may be used as the interactive skirt. The skirt 18 provides a surface to consume reactive species which is separate from the substrate surface. When used, the skirt is dimensioned and placed so that its surface is proximal to the surface of the substrate outside of the footprint area.

As more fully discussed below, the distance d between the terminal end of the outlet 16 and the surface of an etchable substrate 20 can be varied by a reactor support means (not shown). Along with variable height means, the reactor also has means (not shown) to vary the tilt of the reactor with respect to the substrate surface. Because the removal footprint profile varies with the distance between the outlet 16 and the surface of the substrate, these adjustment means allow variations in the removal footprint profile.

As stated earlier, the upstream plasma generation at the plasma chamber 12 may be accomplished in a number of ways. The plasma may be generated by rf excitation of the reactive gas coupled directly, capacitively, or inductively to an rf power source or it may be generated by microwave excitation. Referring to FIG. 2, a directly coupled embodiment having two parallel plate electrodes directly coupled to the plasma and gas mixture is shown. In the parallel plate embodiment, an rf power source 22 is applied to a pair of parallel plate electrodes 24 located at opposite ends of the plasma chamber 12. Gas is continuously fed into the chamber via the inlet 14 where it is converted to a plasma having long-lived active species for etching reactions. The active species are then applied to the surface through the outlet 16.

Figure 3:
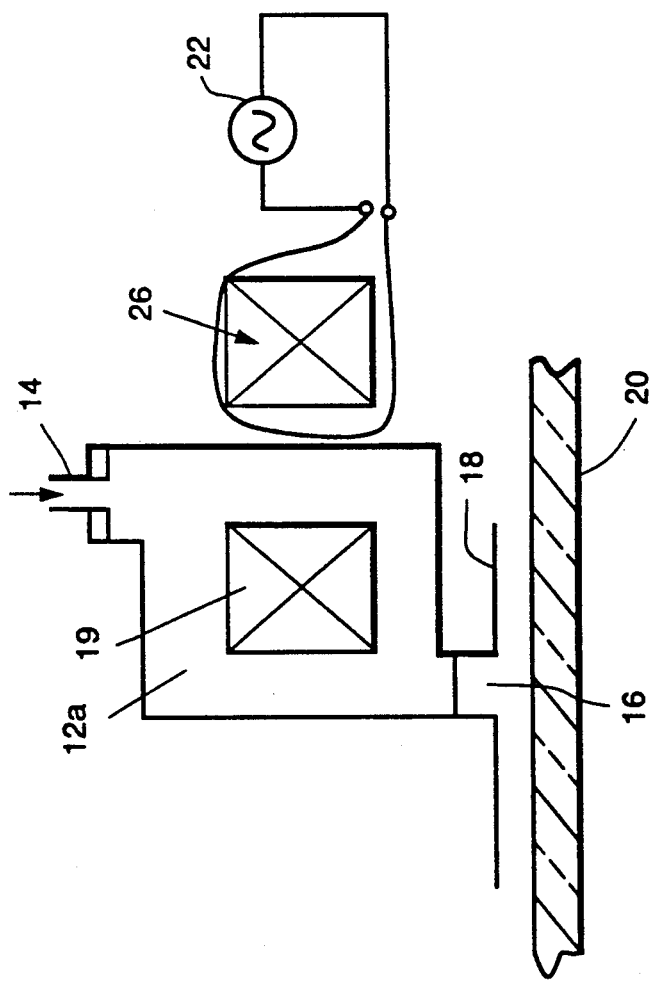
FIG. 3 is a schematic diagram of an inductively coupled downstream plasma reactor system.

Referring to FIG. 3, an inductively coupled embodiment having a ferromagnetic toroidal coil located proximally to a toroidal shaped plasma chamber is illustrated. In the inductive coupling embodiment, gas is fed into the plasma chamber 12a which has a general toroidal shape. The plasma is generated by applying the rf power source 22 to a ferromagnetic toroid 26 placed adjacent to the toroid shaped plasma chamber 12a containing the gas. When the gas breaks down into a plasma, the plasma within the chamber 12a acts as a secondary loop around the toroidal core 19. The plasma and reactive species thereof are flowed through the outlet 16 to the substrate.

FIG. 4 illustrates yet another embodiment wherein the generation of the active species is decoupled from the substrate. In this embodiment, the gas is continuously fed through the inlet 14 and is broken down into a plasma by the application of rf power 22 to a solenoid coil 30 wrapped around the tubular plasma chamber 12b. Depending on the frequency of the rf power, this embodiment may act in a capacitative or inductive manner. Whatever the rf frequency used, the resulting active species are flowed out through the outlet 16 to the substrate surface.

The rf power frequency used to generate the plasma may be anywhere from direct current to microwave (gigahertz). However, each of the above mentioned embodiments works best in certain frequency ranges. For example, direct coupling while in theory operational at all frequencies, is usually limited to frequencies less than one (1) MHz. Inductively coupled embodiments operate best above a frequency where the shunt inductive primary impedance is larger than that of the discharge (usually between 1 KHz and 1 MHz). Capacitive coupling embodiments are best suited to high frequencies (10 MHz to 1 GHz) depending on the geometry of the coupling system. A frequency of 13.5 13 MHz has been successfully used in an inductive coupling embodiment and is a frequency which is readily available.

In addition to the advantages of decoupled generation of the active species of a plasma, the generation of the plasma physically apart and away from the substrate surface in the decoupled embodiments of the present invention yields the advantage of permitting short lived active species such as ions to be temporally filtered out and allowing the much longer lived active species to be carried downstream by the flow of gas so that upon arrival at the etching surface, they are allowed to give up their stored energy to enhance the rate of chemical reaction that permits etching. However, the advantage of decoupled plasma generation requires higher power densities than those of coupled generation. The use of higher power densities results in etching of the local plasma region and higher risks of substrate surface contamination. However, locating the plasma chamber away from the substrate reduces the risk of surface contamination by local etching of the plasma generation region. Superior decoupled plasma generation embodiments for downstream active species generation are embodiments which permit the use of high power densities without forming energetic ion fluxes incident on the walls of the plasma chamber 12 that result in sputter removal and/or accelerated plasma assisted chemical etching of the plasma chamber walls. Inductive coupling embodiments are preferred because the electric fields are parallel to the toroidal plasma chamber and the resulting energy of the ions striking the chamber walls is lower. However, when highly electronegative gases are used in the gas mixture for downstream etching, inductive coupling may not be practical because it is too difficult to generate and sustain a plasma. When an embodiment has a great potential to create a large energetic ion flux at the plasma chamber walls, an important consideration is to select a wall material which has a low sputtering coefficient and a low chemical reactivity with the plasma excited gas. Such wall material considerations prevents contamination of the substrate surface being etched.

Materials that may be etched by the present invention include chromium, aluminum, silicon, silicon dioxide and various other photoresists. The present invention can achieve removal rates as high as 3 microns per minute for common optical and semiconductor materials, such as Si and $SiO_2$. The material removal of optical and semiconductor materials Si and $SiO_2$ can be accomplished with a number of gases when using any of the "downstream" mode embodiments of the present invention. High downstream removal rates (rates greater than 3 microns per minute) can be obtained when nitrogen trifluoride ($NF_3$) or a mixture of gases including $NF_3$ is fed into the plasma chamber. Gases such as $NF_3$ can give rise to small, but unwanted etching outside the localized material removal footprint area. However, the etching can be confined by using the interactive skirt 18 over the substrate and around the localized etch area.

Local etching of the substrate surface is accomplished by moving the outlet orifice 16 along the substrate surface in a manner which is determined by the area of material removal and footprint shape desired. As briefly stated above, the shape of the material removal footprint profile may be changed by varying the distance d between the outlet orifice 16 with interactive skirt 18, and the surface of the substrate 20. By increasing d, a gaussian like profile may be achieved. By decreasing the distance d, a top hat-like profile may be achieved. Operating the downstream removal apparatus of the present invention at a relatively large distance (1 cm) from the substrate 20, the removal of material becomes insensitive to small changes in the distance d that can be caused by a small sag in an optical or other surface being figured. For applications where the deviation in height of the substrate surface is not large (less than 2 mm), the apparatus of the present invention can provide a means for making accurate corrections of substrate errors without having additional means for programmed positional controls of the plasma generator for distance d and tilt with respect to the substrate.

Thus, what has been described is a method and apparatus for performing local plasma assisted chemical etching reactions where the particular electrical and geometric characteristics of the substrate do not influence the generation of active species. Therefore, the present invention provides a means for making local error corrections useful for thinning semiconductor films and figuring optics while avoiding "print through" problems associated with particular substrate characteristics.

What is claimed is:

1. An apparatus for performing localized plasma assisted chemical etching reactions on the surface of an etchable substrate comprising:

a plasma chamber for containing a reactive gas and plasma having an inlet for introducing said reactive gas to said chamber means and an outlet for exhausting said plasma from the plasma chamber;

means for applying excitation to said plasma to convert said reactive gas into said plasma wherein the plasma chamber has a toroidal shape and includes a toroidal core and wherein the means for applying excitation to said reactive gas includes a ferromagnetic toroidal coil located proximate said toroidally shaped plasma chamber such that an inductively coupled plasma within said chamber acts as a secondary loop around the toroidal core; and means for local application of said plasma to the surface of said substrate so as to define an etching footprint having a shape substantially defined by the shape of the plasma chamber outlet.

2. The apparatus of claim 1, wherein the terminating end of the plasma chamber outlet has flange attached thereto located proximally to the surface to be etched so as to form a consumable reactive surface with the plasma.

3. The apparatus of claim 2, wherein the flange is constructed out of a material which is interactive with said plasma.

4. The apparatus of claim 3, wherein the interactive material is carbon.

5. The apparatus of claim 3, wherein the interactive material is silicon.

6. An apparatus for performing local plasma assisted chemical etching reactions on the surface of a substrate comprising:

a plasma chamber for containing a reactive gas and plasma having an inlet for introducing said reactive gas and an outlet for exhausting said plasma from the plasma chamber;

rf discharge means for inductively applying rf excitation to said plasma chamber wherein the plasma chamber has a toroidal shape and includes a toroidal core and wherein the means for applying excitation to said reactive gas includes a ferromagnetic toroidal coil located proximate said toroidally shaped plasma chamber such that an inductively coupled plasma within said chamber acts as a secondary loop around the toroidal core;

an interactive flange attached to the terminating end of the plasma chamber outlet so as to provide a consumable reactive surface proximally to the substrate surface to prevent plasma from reacting with the substrate surface outside of the area defined by the outlet.

7. The apparatus of claim 6, wherein the flange is constructed out of carbon.

8. The apparatus of claim 6, wherein the flange is constructed out of silicon.

* * * * *